United States Patent [19]
Philippe et al.

[11] Patent Number: 5,253,559
[45] Date of Patent: Oct. 19, 1993

[54] DEVICE AND SYSTEM FOR PIERCING PRINTED CIRCUITS

[75] Inventors: Michel Philippe, Vert-Village; Alain Sorel, Les Baux Ste Croix, both of France

[73] Assignee: U.S. Philips Corp., New York, N.Y.

[21] Appl. No.: 717,734

[22] Filed: Jun. 19, 1991

[30] Foreign Application Priority Data

Jun. 26, 1990 [FR] France .................. 90 07994

[51] Int. Cl.$^5$ .................. H05K 13/00; B26F 1/14
[52] U.S. Cl. .................. 83/133; 83/137; 83/138; 83/170; 83/255; 83/639.5; 83/688; 83/690
[58] Field of Search .................. 83/33, 50, 55, 133, 83/137, 138, 142, 170, 171, 255, 256, 639.5, 688, 690

[56] References Cited

U.S. PATENT DOCUMENTS

| | | | |
|---|---|---|---|
| 3,296,912 | 1/1967 | Wanner | 83/461 |
| 3,529,502 | 9/1970 | Krynytzky et al. | 83/461 |
| 3,797,342 | 3/1974 | Sekel | 83/55 |
| 4,516,448 | 5/1985 | Hill et al. | 83/143 |
| 4,646,599 | 3/1987 | Benedict | 83/137 |
| 4,696,210 | 9/1987 | Cain et al. | 83/33 |
| 4,817,477 | 4/1989 | Emery et al. | 83/55 |
| 4,905,556 | 3/1990 | Haack et al. | 83/639.5 |

FOREIGN PATENT DOCUMENTS

| | | |
|---|---|---|
| 0075152 | 3/1983 | European Pat. Off. |
| 2179884 | 3/1987 | United Kingdom |

OTHER PUBLICATIONS

IBM Technical Disclosure Bulletin, vol. 26, No. 10A, Mar. 1984 entitled "Punch Programming Mechanism" by Coneski et al.

*Primary Examiner*—Hien H. Phan
*Attorney, Agent, or Firm*—Ernestine C. Bartlett

[57] ABSTRACT

A first tool assembly includes a punch holder assembly and a circuit board clamp and a second tool assembly includes a die for receiving punches held and driven by the punch holder assembly. A circuit board has holes formed by the punches and is clamped by the clamp to the die. The circuit board and die are aligned to the punch assembly by an alignment pin secured to the punch assembly operated independently of the operation of the punch assembly. The punch assembly and the clamp are independently controlled by actuators with a convex distortion of the punch assembly and clamp during punching to provide an improved clamping and punching action.

7 Claims, 1 Drawing Sheet

DEVICE AND SYSTEM FOR PIERCING PRINTED CIRCUITS

FIELD OF THE INVENTION

The present invention relates to a piercing device for printed circuits provided with a first tool assembly to which are fixed a punch holder block and a hold-down clamp, and with a second tool assembly essentially formed by a die, the device being equipped for introducing a printed circuit board to be pierced between the hold-down clamp and the die, and comprising first controllable means for applying a force on the punch holder block in the direction of the punch stroke and second means which are controllable independently of the first for applying a force on the hold-down clamp in such a direction as to press on the printed circuit board to be punched.

BACKGROUND OF THE INVENTION

A piercing device for printed circuits according to the opening paragraph is known from GB-A-2 179 884 (Hitachi). In the device described in this document, the hold-down clamp and the punch holder block are applied to the piece to be pierced by means of hydraulic cylinders, but the return of the punch holder block is effected by springs (4). Moreover, for the return of the hold-down clamp, the latter is pulled up by the support of the punch holder block by means of tension rods 10. Accordingly, this return cannot be well controlled.

SUMMARY OF THE INVENTION

The invention has for its object the improvement of the quality of the holes or orifices which are realized, i.e. inter alia their geometric precision. A particular object is to provide a device capable of competing with drill piercing devices as regards the quality of the obtained holes (at least for holes of a diameter of 0.7 mm and higher), while providing the highly superior speed of the punching process.

The invention is based on the idea that the precision should depend on the effective control of the forces applied. With the springs according to the prior art, for example, the forces applied are difficult to control.

Therefore, the device according to the invention is characterized in that the first means comprise a variable controllable actuator for applying a force to the punch holder block in the punch return direction, and in that third variable controllable means are provided which on the one hand bear on the punch holder block and on the other hand on the hold-down clamp, thus separating the former from the latter.

The expression "variable controllable means" is understood to mean, for example, one or several sets of hydraulic cylinders, or an electric motor, or an electromagnet, etc, but not a spring which applies a force which cannot be controlled, i.e. cannot be varied at will without moving the component.

The third means render it possible to control the forces applied during the return of the punches more effectively.

In a particular embodiment of the device, at least one of the two tool assemblies is mounted floating, and the hold-down clamp and the die are provided with means for mutual positioning and for positioning relative to the printed circuit.

By thus directly positioning the printed circuit and the punch holder block as well as the die relative to one another, a much improved punching precision is achieved, even if the tolerances for mounting the various elements of the device are otherwise less strict.

To improve the precision of the cutting work still more, since the points of application of the force of the second means are situated near the edges of the punch holder and the hold-down clamp, the latter are prestressed, i.e. they have in the rest state a convex shape with the convexity facing towards the printed circuit.

Also to improve the precision of the cutting work, the device is advantageously provided with means for realizing two successive down/up cycles of the punches with the same punching configuration and on the same printed circuit board, and with means for maintaining the force exerted by the second controllable means while modifying it between the two cycles.

This renders possible a relaxation of the material of the printed circuit (by decreasing the force exercised by the second variable controllable means), so that its dimensions stabilize, after which a second down/up cycle of the punches is carried out.

The device is advantageously provided with means for heating the die and/or the hold-down clamp. The punches penetrating through the holes of the clamp are thus heated by the latter. The printed circuit pressed between the hold-down clamp and the die before the release of the punching cycle is itself also heated. The advantage of heating is that the force necessary for punching is reduced, so that the precision is increased (which precision becomes smaller as the required forces become greater).

It is advantageous if the die is covered by a metal sheet of which the holes are punched by the punches of the device themselves. In this way the diameters of the holes of the die can be greater while nevertheless the material of the printed circuit is well held at the periphery of the hole. Moreover, the sheet may be exchanged in case of wear, instead of redressing the edges of the holes of the die, which operation is much more difficult.

With the machines described in the documents referred to above, in which the punches are provided each with a single cutting edge at the end, the punching action is a simple one, i.e. a punch descends and thereby makes a hole, and then ascends without any new cutting effect. This has the disadvantage that an asymmetrical influence is exercised on the printed circuits, which detracts from the geometric precision of the edges of the holes realised.

To avoid this disadvantage, the punches are advantageously provided with a second cutting edge which is oriented in the opposite direction to that of the cutting edge referred to above and which has the task of cutting during the punch return movement. The said second cutting edge may be constituted in that the punch comprises a throat of which a rim forms this cutting edge.

A punching system for printed circuits is advantageously formed by several devices according to the invention, each of them punching a configuration of holes different from that of the other devices. Thus the dimensions of each device are smaller and the precision is even more improved. Shifting due to heating of the device and of the board is particularly limited by this.

The following description with reference to the annexed drawings describing non-limitative examples will make it better understood how the invention may be carried into practice.

DESCRIPTION OF THE PREFERRED EMBODIMENTS

Figure 1:
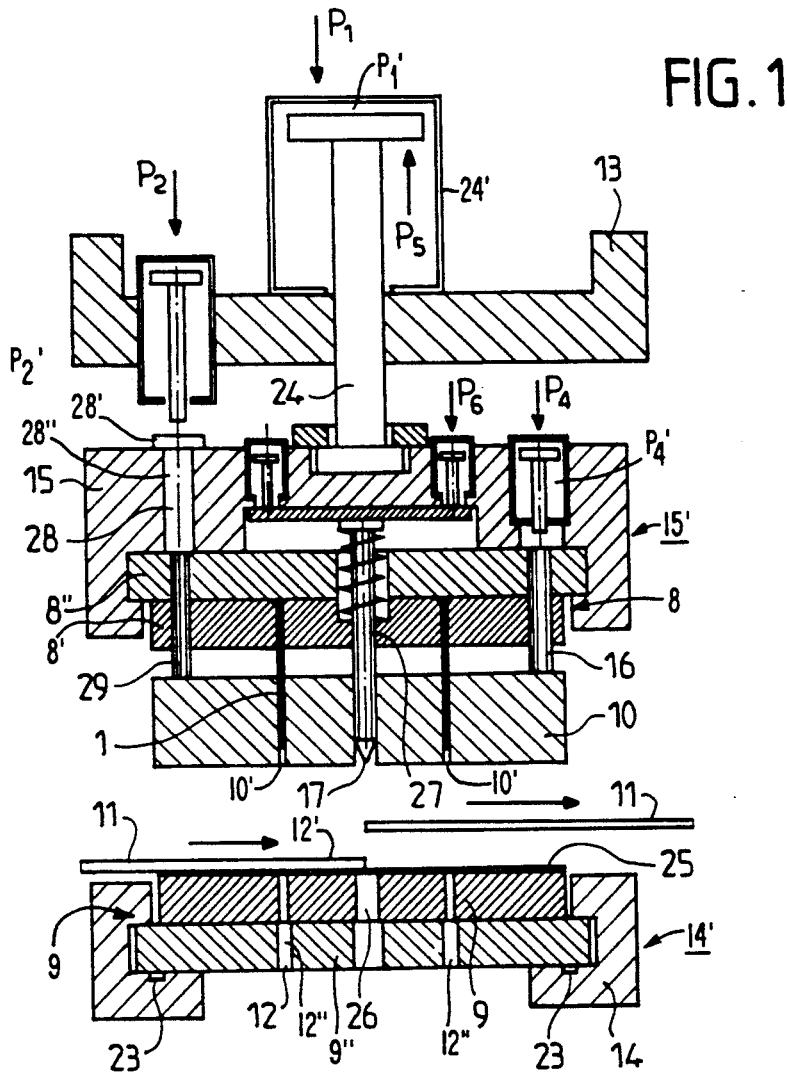
FIG. 1 is a diagrammatic lateral cross-section of a device according to the invention. Different parts of the cross-section may correspond to different planes in the device so as to show a maximum of elements in one and the same Figure.

The device shown in FIG. 1 comprises:

- a frame consisting of elements which are screwed, soldered, or cast together, of which only two fixed parts, 13 (top) and 14 (bottom) are shown diagrammatically;
- an upper tool assembly 151 which can glide vertically relative to the fixed parts. This upper tool assembly comprises a support 15 which may be mounted, for example, on classic columns with balls and which is integral with a punch holder assembly block 8, which in its turn supports a hold-down clamp 10 with vertical gliding possibility. The punch holder assembly 8 comprises a lower part 81 which is the actual punch holder, in which the punches 1 are placed (of which only one is shown), and of an upper part or ram 8″. The hold-down clamp 10 is provided with holes 101 (of which only one is shown) through which the punches 1 (of which only one is shown) are passed;
- a lower tool assembly 141 which is a die assembly 9 supported by the frame element 14 by means of an air cushion system 23, which leaves it sufficiently free for being centered by means of a fine control. The die assembly 9 is made of two parts, an upper part 9′ which is the actual die and a lower part or die support 9″ which rests on the air cushion. Assembly 9 is pierced with holes 12 (of which only one is shown) for allowing the punches 1 to pass. Holes 12 include a narrower diameter hole 12′ in upper part 9′ and a larger diameter hole 12″ in lower support 9″ and aligned with hole 12′.

The configuration and shape of the orifices (not shown) to be punched in a circuit board 11 is obviously different for each type of circuit. There are several known means for obtaining a given configuration of punches: it is possible to use an assembly of punches which are present at each point in a grid (for example at a pitch of 2.54 mm), whereby only those punches for example, punch 1 which correspond to the desired configuration are operated either by actuators (as described, for example, in: IBM Disclosure Bulletin, vol. 26 no. 10A, March 1984, p. 5100), or by means of a template (as described, for example, in FR-A-2 248 666). It is also possible, starting from a punch support which has a mounting possibility for a punch at each point of a grid, to mount punches only in those positions which correspond to the desired configuration. As regards the hold-down clamp 10 and the dies, these preferably comprise a hole at each position of a grid.

The up/down movement of the punch holder 8 relative to the die assembly 9 is controlled by a central hydraulic cylinder P1 (which forms a first variable controllable means). The hold-down clamp 10 is controlled in its downward movement by the cylinders P2 (which form a second variable controllable means), of which only one is shown, and which are separate from and independent of the cylinder P1 which controls the punch holder assembly 8. Accordingly, this renders it possible to apply independent and perfectly controlled forces to the hold-down clamp 10 and punch holder assembly 8.

The actuators P2 press on the intermediate pins 28 which have the shape of a bolt (only one is shown) and of which the head 28′ presses on the support 15, while the shaft 28″ runs through this support 15 in order to press on the punch holder assembly 8 upper part ram 8″. The hold-down clamp 10 is provided with columns 29 (only one is shown) which slide with the smallest possible clearance in the punch holder assembly 8. These columns issue from the punch holder at the upper side opposite the lower ends of the pins 28, so that ultimately the actuators P2 press on the hold-down clamp 10 through the interposition of the pins 28 and columns 29. The support 15 and the punch assembly 8 descend simultaneously with the hold-down clamp 10, but they can also, owing to the action of the actuator p1, descend alone, thus filling the gap initially existing between the assembly 8 and clamp 10.

The hold-down clamp 10 is moreover connected to the punch holder assembly 8 by further columns 16 (only one is shown) which also slide in the punch holder assembly 8, and on which can press an assembly of actuators P4 (which form a third variable controllable means) of which only one is shown, so as to space the punch holder assembly 8 and the hold-down clamp 10 from one another.

Since the points of application of the actuators P2 are situated near the edges of the hold-down clamp 10, the latter is prestressed, i.e. it has in the rest state a convex shape with its convexity facing towards the printed circuit board 11. This shape has the object of compensating for the deformation produced by the pressure action on the printed circuit board. Similarly, since the points of application of the punch holder assembly 8 on its support 15 are situated near the supported edges of the punch holder assembly 8, the latter is prestressed, i.e. it has in the rest state a convex shape with its convexity facing towards the printed circuit. However, the convexities of the punch holder assembly 8 and of the hold-down clamp 10 are very slight and are not visible in the figure.

Since the die assembly 9 is supported by an air cushion 23 which leaves it free to move in the horizontal direction, the hold-down clamp 10 and the die assembly 9 are provided with positioning means relative to the printed circuit board 11, so that they can nevertheless be positioned with precision. These means are pins with tapering ends 17 (there are two: one at either side of the device) guided laterally in that they pass with the smallest possible clearance through the holes 27 of the punch holder block assembly 8, which pins are to engage with the smallest possible clearance in the holes 26 of the die assembly 9. The printed circuit board 11 may also be pierced with centering holes in accordance with the same configuration in advance, so that it is positioned relative to the parts of the device of FIG. 1 by the same pins, which pass first through the holes of the printed circuit board and then enter those of the die assembly 9.

The pin 17 is driven in its downward movement by an assembly of actuators P6.

It is also conceivable to mount the upper tool assembly 15' on an air cushion or other means which leaves lateral clearance, the die assembly 9 then being fixed. With the configuration of the device shown here by way of example this would be more complex given the great number of moving elements which form the upper tool assembly, but it could be practicable in a different configuration.

The device of FIG. 1 is provided with heating means (not shown) for regulating the temperature of the die assembly 9 and that of the hold-down clamp 10, which means may, for example, be constructed as electrical resistance heaters incorporated in each of the elements, with built-in measuring probes which act on a known electric control device for controlling the electric power applied to the resistance heaters. In addition to the advantages already mentioned for this heating, the control renders it possible to obtain an exact temperature and, therefore, a reproducible expansion of the printed circuit boards, so a higher degree of precision.

The operating cycle of the device is as follows: in a first phase in which the circuit is loaded, the central actuator P1 is in the high position as indicated by the arrow adjacent to the reference designation P5, the other actuators are idle, and the device is in the position as drawn. A printed circuit board 11 is loaded, after which the means for handling the board are retracted. In the following phase, the centering means (pin 17) move down through the action of actuators P6: the pin 17 descends relative to the assembly of punch holder/hold-down clamp and passes to below the hold-down clamp 10. In the next phase, the assembly of punch holder assembly 8 and hold-down clamp 10 moves down integrally under the influence of the actuators P2, but the punches 1 still do not pass beyond the lower exterior surface of the hold-down clamp 10. The clamp 10 thus comes into contact with the printed circuit board 11. It carries along the piston 24 of a central hydraulic cylinder 24', thus compressing the oil in the chamber P5, while simultaneously a chamber P1' is filled without exercising a force on the piston 24, or with a weak force (lower than the punching force). A predetermined pressure is then applied and the printed circuit board 11 assumes the temperature of the hold-down clamp 10 and the die assembly 9 between which it is pressed. This takes some three seconds. In the next phase, punching takes place through the action of the actuator P1, while the actuators P2 and P6 remain under pressure. In the next phase the opening-up takes place: pressure in the cylinders P1' and P2 decreases and a pressure is established in the cylinder P4', which acts on the hold-down clamp 10 through the columns 16 to separate the hold-down clamp and punch holder assembly and allow the support 15 and the punch holder assembly 8 to subsequently move up.

The device is provided with means for modifying the pressure on the hold-down clamp 10, for example, a known automatic unit (not shown) suitably programmed for diminishing the oil pressure in the cylinder P2'. This renders it possible to retain the material of the printed circuit board 11, after which a second punching cycle is realized with the same tool and on the same printed circuit board, while maintaining the reduced pressure. It is obviously desirable to maintain a minimum pressure for keeping the printed circuit board fixed in position.

Finally the tool assembly 15' is made to move up: the pressures in the cylinders of actuators P6 and P4 are eliminated or inverted and a pressure is established in the controllable actuator P5 for applying a force on the punch holder assembly 8 in the punch return direction (upwardly), which again returns the device to the position shown in the drawing, so that the printed circuit board 11 can be removed.

The diameters of the holes 12' and 12" of the die assembly 9 are large enough for allowing the punches to pass in spite of the considerable tolerances as regards the position of the punch holder. It is clear that mounting with considerable tolerances is less costly than mounting with great precision. To avoid the disadvantages which could result from this for the geometric precision of the holes realized, the die assembly 9 is covered with a metal sheet 25 whose holes have been pierced by the punches of the device themselves: this sheet is made of very hard steel (for example, a silicon steel), and it is mounted while still without holes, after which a punching cycle without product is carried out, which has the effect of piercing the sheet 25 with great precision in the desired locations. It is clearly advantageous for the die assembly 9 to have a hole at each position of a universal grid, the holes not used being covered by the metal sheet. The die is thus a universal tool, while the metal sheet is changed whenever a new circuit model is to be punched.

Figure 2:
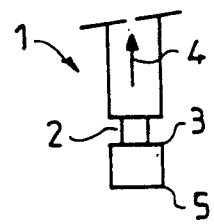
FIG. 2 represents a cross-section of the end of a punch according to a first embodiment.

The end of the punch 1 shown in FIG. 2 is provided with a rim having a cutting edge 5 and comprises moreover a throat 2 of which a rim 3 forms a second cutting edge which points in the opposite direction to cutting edge 5 referred to above and which has the function of cutting during the punch movement in the direction indicated by an arrow 4, i.e. during the return movement of the punch.

Figure 3:
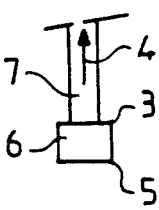
FIG. 3 represents a cross-section of the end of a punch according to a second embodiment.

In a modification, the end of the punch shown in FIG. 3 is also provided with a rim with a cutting edge 5 and comprises in addition two bodies 6 and 7 of different diameters, while a rim 3 of the body 6 of greater diameter forms a second cutting edge which faces in the opposite direction to cutting edge 5 referred to above and which has the function of cutting during the punch movement in the direction shown by the arrow 4, i.e. during the return movement of the punch.

The force necessary for punching the holes which are most usual in printed-circuit technology is of the order of 70 decanewtons, and since the number of holes of a "quarto", i.e. of a printed circuit board forming an integral unit, may be several hundred, this will lead to extremely high forces on the components of the device of the order of 50 kilonewtons per square decimeter of printed circuit, which forces are detrimental to the precision of the device. To eliminate this disadvantage, provision is made for piercing the quartos in several stages. For example, it is possible to process quartos of 508 × 404 mm and a thickness of 1.6 mm in five to seven successive operations. If a quarto comprises a large number of small patterns which repeat themselves, it may be processed in several stages in the same device, by advancing it each time by once or several times the value of the pitch between the patterns.

Figure 4:
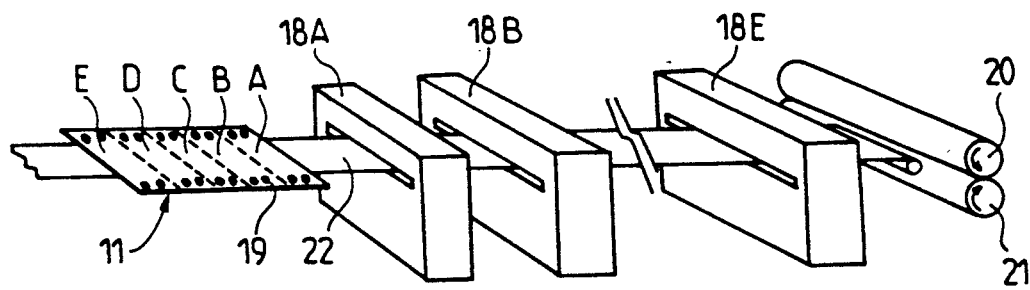
FIG. 4 is a diagrammatic perspective view of a punching system consisting of several devices according to the invention.

If, on the other hand, the configuration of holes extends all over the quarto without repetitions, it is necessary to act otherwise. FIG. 4 shows a quarto 11 on which five zones A, B, C, D, E are indicated. If the main consideration is to economize on investment, it is possible to use only one device. This would first punch portion A. A complete series of quartos to be manufactured is then passed through this device, after which the device is modified (positions of punches and metal sheet 25) to adapt it to punching of the portion B, upon which the entire series of quartos is passed for a second time through the device, and so on for the portions C, D, E.

This could be convenient for small series of circuits, but in practice, if more considerable series are to be obtained, the preferred system is that of FIG. 4 formed by several devices 18A to 18E, each of them being as described above, and each of them punching one configuration of holes which is different from that of the others: the device 18A punches the portion A of the printed circuit, the device 18B punches the portion B, etc.

The system consisting of several devices has the additional advantage that in the case in which two holes are too close together, so that two adjoining punches cannot be mounted on the same punch holder for this, it is possible to realize these two holes successively in two different devices (which then treat the same zone).

The quartos may be handled between the successive devices by any known device, here by a belt conveyor 22, for example. The selection of the zone to be processed and its centering takes place in each device.

The system may be provided with means for exercising a pressure on the printed circuits after punching. FIG. 4, for example, shows a kind of press formed by two rollers 20, 21 which are pressed against one another by a spring assembly or by hydraulic cylinders (which may be controlled for applying a given force) and between which the forced movement of the printed circuits takes place.

With a system according to the invention, it is possible to produce a quarto every ten to twenty seconds, whereas this requires approximately four minutes in the case of drilling, while the quality obtained approaches that obtained by drilling, which is sufficient in the large majority of cases for realizing double-sided circuits with metallized holes.

What is claimed is:

1. A punching device for piercing a printed circuit board comprising a first tool assembly, a punch holder assembly and a hold-down clamp each secured to the first tool assembly, a second tool assembly comprising a die, at least one of the two tool assemblies being mounted floating relative to the other tool assembly, the device being adapted for introduction of a printed circuit board to be pierced between the hold-down clamp and the die, said device including means for mutual positioning said hold-down clamp relative to said die and for positioning said die relative to the printed circuit board, first variable controllable means for applying a force on the punch holder assembly in the direction of a punch stroke and second variable controllable means controllable independently of the first variable controllable means for applying a force on the hold-down clamp in such a direction as to press on the printed circuit board to be punched, said first variable controllable means comprising a controllable actuator for applying a force to the punch holder assembly in a punch return direction, and third variable controllable means which act on the hold-down clamp for separating the punch holder assembly from the hold-down clamp after the punch stroke.

2. A punching device for piercing a printed circuit board comprising a first tool assembly, a punch holder assembly which includes a plurality of punches and a hold-down clamp each secured to the first tool assembly, a second tool assembly comprising a die, the die being covered by a metal sheet whose holes have been punched by said punches, the device being adapted for introduction of a printed circuit board to be pierced between the hold-down clamp and the die, first variable controllable means for applying a force on the punch holder assembly in the direction of a punch stroke and second variable controllable means controllable independently of the first variable controllable means for applying a force on the hold-down clamp in such a direction as to press on the printed circuit board to be punched, said first variable controllable means comprising a controllable actuator for applying a force to the punch holder assembly in a punch return direction, and third variable controllable means which act on the hold-down clamp for separating the punch holder assembly from the hold-down clamp after the punch stroke.

3. A punching device for a printed circuit board as claimed in claim 2 including a plurality of punches secured to the punch holder assembly having punch and return movements, each of said punches having a rim having a first cutting edge and a second cutting edge which is oriented in the opposite direction to that of the first cutting edge and which cuts during the punch return movement.

4. A punching device for a printed circuit board as claimed in claim 3, characterized in that wherein said second cutting edge is formed on a rim of a throat formed in the corresponding punch.

5. A printed circuit board hole punching device comprising:
   a first tool assembly including a punch holder assembly and a circuit board clamp;
   said punch assembly including at least one circuit board hole forming punch secured thereto;
   a second tool assembly including a die for receiving said at least one hole forming punch;
   first variable controllable means for displacing the punch holder assembly and said at least one punch for forming at least one hole in the circuit board in a punch stroke;
   second variable controllable means for causing the clamp to clamp the circuit board independently of the operation of said first means; and
   third variable controllable means coupled to the clamp and punch assembly for separating the clamp and the punch holder assembly.

6. The device of claim 5 wherein the first and second tool assemblies include alignment means for aligning the first tool assembly to the second tool assembly and operated independently of the first, second and third variable controllable means.

7. The device of claim 5 wherein said first, second and third variable controllable means include fluid operated means for independently operating said first, second and third controllable means.

* * * * *